US012386693B2

(12) United States Patent
Chiang

(10) Patent No.: US 12,386,693 B2
(45) Date of Patent: Aug. 12, 2025

(54) FAULT DETECTION SYSTEM, STORAGE DEVICE AND SERVER

(71) Applicant: Fulian Precision Electronics (Tianjin) Co., LTD., Tianjin (CN)

(72) Inventor: Chen-En Chiang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 34 days.

(21) Appl. No.: 18/430,980

(22) Filed: Feb. 2, 2024

(65) Prior Publication Data
US 2025/0208945 A1 Jun. 26, 2025

(30) Foreign Application Priority Data
Dec. 22, 2023 (CN) .......................... 202311789218.5

(51) Int. Cl.
G06F 11/00 (2006.01)
G01R 19/165 (2006.01)
G06F 11/07 (2006.01)

(52) U.S. Cl.
CPC .... *G06F 11/0793* (2013.01); *G01R 19/16576* (2013.01); *G06F 11/0709* (2013.01); *G06F 11/0751* (2013.01)

(58) Field of Classification Search
CPC ............. G06F 11/0793; G06F 11/0709; G06F 11/0751; G01R 19/16576; G01R 19/16514; G01R 19/16519; G01R 19/16528; G01R 19/16533; G01R 19/1659
USPC ....................................................... 714/1–57
See application file for complete search history.

(56) References Cited

U.S. PATENT DOCUMENTS

| 9,032,250 B1* | 5/2015 | Krieger .................... G06F 11/24 714/14 |
| 9,590,503 B2 | 3/2017 | Lai et al. |
| 2010/0192010 A1* | 7/2010 | Ikuwa ....................... H02J 3/00 713/340 |
| 2010/0202240 A1* | 8/2010 | Moshayedi ............ G11C 16/30 365/228 |
| 2012/0102356 A1* | 4/2012 | Kubota ................ G06F 11/2015 714/14 |
| 2023/0094178 A1* | 3/2023 | Koga ........................ H02H 7/20 714/14 |
| 2024/0116490 A1* | 4/2024 | Maclin .................... B60L 53/24 |

FOREIGN PATENT DOCUMENTS

| CN | 105186859 A | 12/2015 |
| CN | 112652348 A | 4/2021 |

* cited by examiner

*Primary Examiner* — Sarai E Butler
(74) *Attorney, Agent, or Firm* — ScienBiziP, P.C.

(57) ABSTRACT

Disclosed in the present application is a fault detection system, a storage device and a server. The fault detection system includes a supercapacitor circuit, a switch module and a controller module, the supercapacitor circuit is configured to obtain electrical energy from the voltage conversion circuit and store the electrical energy, the switch module is configured to conduct or disconnect a connection between the supercapacitor circuit and the voltage output terminal, the controller module is configured to turn on the switch module, obtain state information of the storage device, and control a reminder circuit to output reminder information based on the state information when the first voltage is less than a voltage threshold.

20 Claims, 5 Drawing Sheets

FAULT DETECTION SYSTEM, STORAGE DEVICE AND SERVER

FIELD

The present disclosure relates to the technical field of servers, and specifically to a fault detection system, a storage device, and a server.

BACKGROUND

Baseboard management controllers (BMCs) or microcontroller units (MCUs) are often used in servers, just a bunch of flash (JBOF) or just a bunch of disks (JBOD) to record error messages, allowing maintenance personnel to use the error messages to find out where electronic circuits are damaged and information about hard disk damage. In the event of an unexplained shutdown and the power supply unit (PSU) is unable to supply power, it is not possible to directly obtain information such as the location of the failure to quickly replace the damaged hard disk device, which will make it more difficult to efficiently maintain the data center. Even if the system uses a backup power supply, complex hardware and software structures need to be configured, and maintenance personnel cannot quickly tell where electronic circuits have been damaged and where the hard disk has been damaged.

Therefore, improvement is desired.

DETAILED DESCRIPTION

In the embodiments of the present application, the terms "exemplary" or "for example" are used to denote examples, illustrations, or descriptions, any embodiment or design solution described as "exemplary" or "for example" in the embodiments of the present application should not be construed as being preferred or advantageous over other embodiments or design solutions. The use of the terms "exemplary" or "for example" is intended to present the concepts in a concrete manner.

When a component is referred to as "electrically connected" to another component, it can be directly connected to another component or there can be a centered component present. When a component is "electrically connected" to another component, it can be a contact connection, for example, it can be a wire connection, or it can be a non-contact connection, for example, it can be a non-contact coupling method.

Baseboard management controllers (BMCs) or microcontroller units (MCUs) are often used in servers, just a bunch of flash (JBOF) or just a bunch of disks (JBOD) to record error messages, allowing maintenance personnel to use the error messages to find out where electronic circuits are damaged and information about hard disk damage. In the event of an unexplained shutdown and the power supply unit (PSU) is unable to supply power, it is not possible to directly obtain information such as the location of the failure to quickly replace the damaged hard disk device, which will make it more difficult to efficiently maintain the data center. Even if the system uses a backup power supply, complex hardware and software structures need to be configured, and maintenance personnel cannot quickly tell where electronic circuits have been damaged and where the hard disk has been damaged.

In order to solve the above problems, the present application provides a fault detection system, a storage device and a server to quickly locate a faulty storage unit when the PSU is unable to supply power.

Embodiments of the present disclosure are further described below in conjunction with the accompanying drawings.

Figure 1:
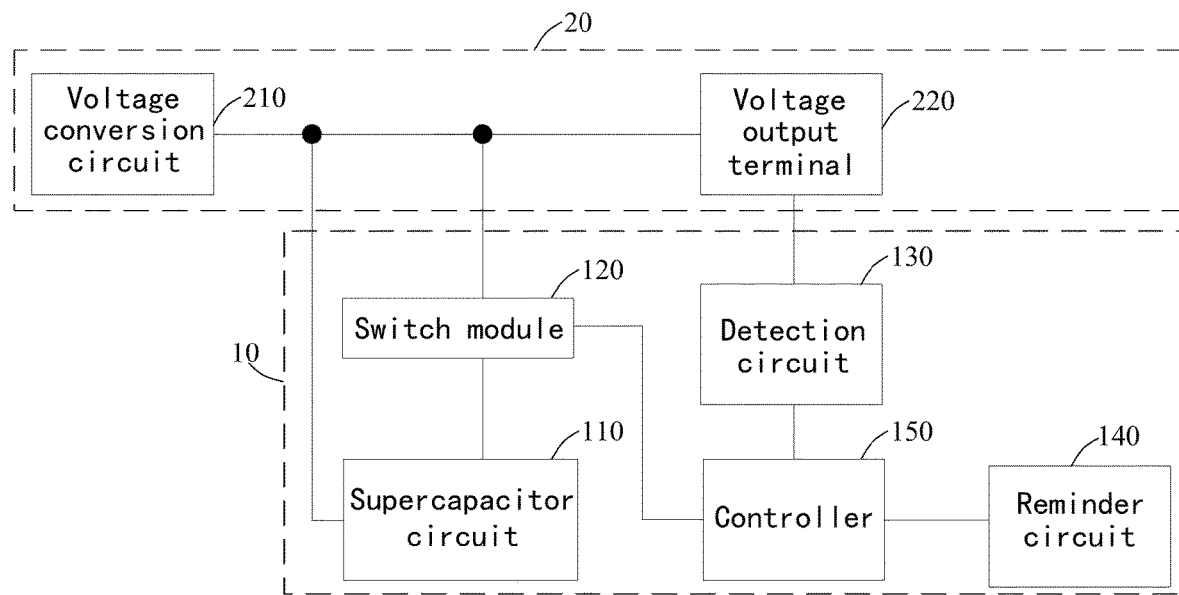
FIG. 1 is a block diagram of a fault detection system according to an embodiment of the present disclosure.

FIG. 1 illustrates a fault detection system 10 in accordance with an embodiment of the present disclosure.

The fault detection system 10 is applied to a storage device 20. The fault detection system 10 is used to quickly identify memory that has failed when the storage device 20 is powered down. The storage device 20 can be any electronic device provided with a memory. The memory may be replaceable storage. For example, in some embodiments, the storage device 20 may be a redundant arrays of independent disks (RAID) storage device, a JBOD storage device, a JBOF storage device, or other server. The present application does not limit the specific type of the storage device 20.

The storage device 20 includes a voltage conversion circuit 210 and a voltage output terminal 220. The voltage conversion circuit 210 is used to convert a first supply voltage of an external power (not shown in figures) and output a second supply voltage to the voltage output terminal 220. For example, the voltage conversion circuit 210 includes an AC/DC conversion circuit, the voltage conversion circuit 210 can receive a 220V alternating current (AC) voltage or a 110V AC voltage from the external power, and convert the 220V voltage or the 110V voltage into a direct current (DC) voltage and output the DC voltage through the voltage output terminal 220. In one embodiment, the voltage conversion circuit 210 can be a PSU. The voltage output terminal 220 is used to output a first voltage to supply power to the fault detection system 10. The voltage output terminal 220 is connected to each power input port of the fault detection system 10, at least one DC/DC conversion circuit can be installed at the voltage output terminal 220 to convert the DC power output by the voltage conversion circuit 210 into a power supply voltage suitable for the electrical unit, such as 12V, 5V, 3.3V, and other types of DC voltage.

The fault detection system 10 includes a supercapacitor circuit 110, a switch module 120, a detection circuit 130, a reminder circuit 140, and a controller 150.

In the embodiment, a first end of the supercapacitor circuit 110 is connected between the voltage conversion circuit 210 and the voltage output terminal 220, a second end of the supercapacitor circuit 110 is connected to a first end of the switch module 120. A second end of the switch module 120 is connected between the voltage conversion circuit 210 and the voltage output terminal 220. A first end of the controller 150 is connected to a third end of the switch module 120, a second end of the controller 150 is connected to a first end of detection module detection circuit 130, a second end of the detection circuit 130 is connected to the voltage output terminal 220, and a third end of the controller 150 is connected to the reminder circuit 140.

In the embodiment, the controller 150 is used to control the state of the switch module 120. For example, the controller 150 can outputs a first control signal to the switch module 120 to turn on the switch module 120, and the controller 150 can outputs a second control signal to the switch module 120, to turn off the switch module 120.

The supercapacitor circuit 110 is used to obtain electrical energy from the voltage conversion circuit 210 and store the electrical energy, when the switch module is turned on, the switch module conducts the connection between the supercapacitor circuit and the voltage output terminal, when the switch module is turned off, the switch module disconnects the connection between the supercapacitor circuit and the voltage output terminal.

When the switch module 120 is turned on, the switch module 120 can conduct the connection between the supercapacitor circuit 110 and the voltage output terminal 220, so that the supercapacitor circuit 110 outputs voltage to the voltage output terminal 220. When the switch module 120 is turned off, the switch module 120 disconnects the connection between the supercapacitor circuit 110 and the voltage output terminal 220, so that the voltage of the supercapacitor circuit 110 cannot be output to the voltage output terminal 220. The switch module 120 includes, but is not limited to, a gate switch, a transistor, a relay, the present application does not limit the specific type of the switch module 120, only that the switch module 120 can control the conduction or disconnection of the path between the supercapacitor circuit 110 and the voltage output terminal 220.

The detection circuit 130 is used to detect the voltage at the voltage output terminal 220. The detection circuit 130 includes electronic components such as a voltage sensor, an amplifier, a resistor. The present application does not limit the specific circuit structure of the detection circuit 130, only that the detection circuit 130 can at least accomplish the voltage detection function.

The reminder circuit 140 is used to output a reminder information. The reminder circuit 140 includes a speaker or a light-emitting diode (LED). The reminder information includes, but is not limited to, the speaker chirping, the LED lights blinking or going out.

When the voltage of the voltage output terminal 220 is less than a voltage threshold, the controller 150 is used to turn on the switch module 120 and obtain error information of the storage device 20, and control the reminder circuit 140 to output the reminder information based on the error information. In the embodiment, the controller 150 may be a complex programmable logic device (CPLD). In other embodiments, the controller 150 may be a field programmable logic gate array (FPGA) or a microcontroller unit (MCU).

The fault detection system 10 illustrated in FIG. 1 operates generally as follows:

When the voltage conversion circuit 210 is in an operating state, the voltage conversion circuit 210 converts the voltage input from an external power supply and outputs a voltage to the voltage output terminal 220. The voltage output terminal 220 supplies power to the various power-using units in the fault detection system 10, for example, the voltage output terminal 220 supplies power to the controller 150 and the reminder circuit 140. When the controller 150 determines that a first voltage is greater than or equal to the voltage threshold, the controller 150 maintains the state in which the switch module 120 is turned off, and the supercapacitor circuit 110 further obtains the electrical energy output from the voltage conversion circuit 210 for charging.

When the controller 150 determines that the first voltage is less than the voltage threshold, it indicates that the voltage conversion circuit 210 fails or there is no external power input, and the storage device 20 may be shut down due to the lack of electrical energy to maintain operation. Therefore, the controller 150 turns on the switch module 120 to conduct the connection between the supercapacitor circuit 110 and the voltage output terminal 220, the supercapacitor circuit 110 may output a voltage to the voltage output terminal 220 through the switch module 120, and the voltage output terminal 220 may supply power to the fault detection system 10. Due to the power supply of the supercapacitor circuit 110, the controller 150 may continue to obtain the state information of the storage device 20 and control the reminder circuit 140 to output reminder information based on the state information. Therefore, the maintenance personnel can directly maintain the storage device 20 without rebooting the storage device 20.

Even if the maintenance personnel is not able to repair the storage device 20 in time, the state information of the storage device 20 can be stored by the controller 150 because the controller 150 has acquired the state information of the storage device 20, in order to repair the storage device 20 by means of the state information saved by the controller 150 when the storage device 20 is re-powered.

The present application can supply power to the fault detection system 10 by replenishing the voltage output terminal 220 through the supercapacitor circuit 110 and the switch module 120 when the voltage conversion circuit 210 fails or when there is no external power supply input to maintain the controller 150 to continue operation. The controller 150 may continue to obtain state information and control the reminder circuit 140 to output the reminder information based on the state information, which in turn allows the maintenance personnel to replace a faulty memory in the storage device 20 or repair the malfunction in the storage device 20 based on the reminder information. Even if the storage device 20 is turned off due to a power failure, the faulty memory in the storage device 20 can be quickly determined, due to the supercapacitor circuit 110 supplies power to the fault detection system 10 through the voltage output terminal 220, and the operation time of the reminder circuit 140 is prolonged as much as possible.

Figure 2:
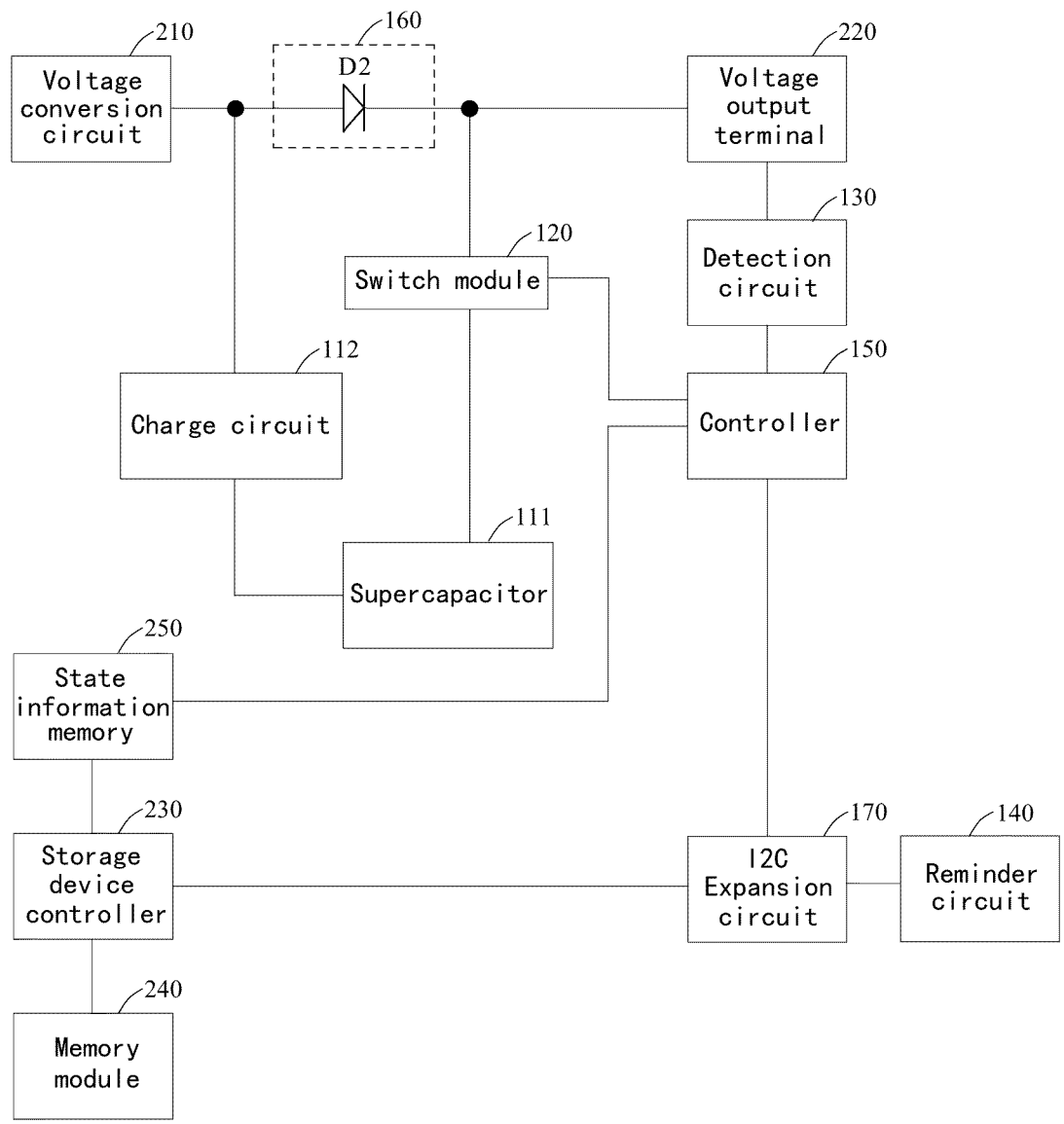
FIG. 2 is another block diagram of the fault detection system according to an embodiment of the present disclosure.

Referring to FIG. 2, in one embodiment, the supercapacitor circuit 110 includes a supercapacitor 111 and a charge circuit 112. The fault detection system 10 further includes an anti-reverse circuit 160. The anti-reverse circuit 160 is connected between the voltage conversion circuit 210 and the voltage output terminal 220. A first end of the switch module 120 is connected between the anti-reverse circuit 160 and the voltage output terminal 220, a second end of the switch module 120 is connected to a first end of the supercapacitor 111, a second end of the supercapacitor 111 is connected to a first end of the charge circuit 112, a second end of the charge circuit 112 is connected between the voltage conversion circuit 210 and the anti-reverse circuit 160.

The charge circuit 112 is used to convert the second supply voltage output by the voltage conversion circuit 210 into a second voltage, and the charge circuit 112 can output the second voltage to charge the supercapacitor 111. In some embodiments, the charge circuit 112 may be a DC/DC conversion circuit. The supercapacitor 111 is used to store the electrical energy and output a voltage to the voltage output terminal when the switch module is turned on.

The supercapacitor 111 is used to store electrical energy and outputs a voltage to the voltage output terminal 220 when the switch module 120 is turned on.

The anti-reverse circuit 160 is used to prevent the current of the supercapacitor circuit 110 from flowing back into the voltage conversion circuit 210. The anti-reverse circuit 160 is used to prevent the current of the supercapacitor 111 from flowing back into the voltage conversion circuit 210. In some embodiments, the anti-reverse circuit 160 includes a diode D2. The anode of the diode D2 is connected between the voltage conversion circuit 210 and the supercapacitor circuit 110, and the cathode of the diode D2 is connected between the voltage output terminal 220 and the first end of the switch module 120. The present application does not limit the specific circuit structure of the anti-reverse circuit 160, only the anti-reverse circuit 160 is required to achieve the corresponding anti current backflow function.

In some embodiments, the storage device 20 further includes a storage device controller 230, a memory module 240, and a state information memory 250.

The storage device controller 230 is connected to the state information memory 250 and the memory module 240. The state information memory 250 is connected to the controller 150 of the fault detection system 10. The storage device controller 230 is also connected to the reminder circuit 140 of the fault detection system 10.

The storage device controller 230 is the control center of the storage device 20, and the storage device controller 230 utilizes various interfaces and wiring to connect to various portions of the entire storage device 20, to call up data and/or program instructions within the memory of the storage device 20, to perform various functions of the storage device 20, and/or to process data, so as to provide overall management and control of the storage device 20. In some embodiments, the storage device controller 230 may be a central processor, microprocessor, microcontroller, or other chip with data processing capabilities. For example, when the storage device 20 is a server, the storage device controller 230 may be a CPU.

The memory module 240 includes a plurality of memories, and the plurality of memories are replaceable memories.

The state information memory 250 is used to store state information of the device 20. The state information includes voltage information, current information. The state information further includes fault information and the address of each memory in the memory module 240. The state information memory 250 includes electrically erasable programmable read only memory (EEPROM), cache, flash memory (FLASH). The present application does not limit the specific types of the state information memory 250.

In the embodiment, the reminder circuit 140 includes a plurality of LEDs. The plurality of LEDs can correspond to the plurality of memories one by one, and the state of each LED is used to indicate the operation state of the corresponding memory. The present application can visually determine the state of each memory in the memory module 240 by the state of the corresponding LEDs. The state of the LED includes a first state and a second state, and when the LED is in the first state, it indicates that the corresponding memory has malfunctioned or is not connected to the storage device 20. When the LED is in the second state, it indicates that the corresponding memory is connected to the storage device 20 and is in a normal operating state. For example, the first state is a blinking state, and the second state is an off state.

In some embodiments, the fault detection system 10 further includes an expansion circuit 170, a first end of the expansion circuit 170 is connected to the storage device controller 230, and a second end of the expansion circuit 170 is connected to the reminder circuit 140, a third end of the expansion circuit 170 is connected to the controller 150. The expansion circuit 170 is used to realize the control of the reminder circuit 140 by the controller 150 or the storage device controller 230.

The expansion circuit 170 includes a plurality of I2C interfaces and input/output expansion circuits. The controller 150 and the storage device controller 230 both store a corresponding control program for the expansion circuit 170. When the voltage conversion circuit 210 is operating normally, the storage device controller 230 may control the reminder circuit 140 to output reminder information based on the state information in the state information memory 250. When the voltage conversion circuit 210 is unable to supply power and switches to the supercapacitor circuit 110 to supply power, the controller 150 may obtain the state information from the state information memory 250 and control the reminder circuit 140 to output reminder information based on the state information.

In some embodiments, each byte within the preset space in the state information memory 250 corresponds to a set of memory units in the memory module 240, respectively. Each bit in each byte corresponds to each memory unit in the memory. For example, when the data of the corresponding bit in the memory is 0, it indicates that the memory is in a normal operating state. When the data of the corresponding bit in the memory is 1, it indicates that the memory has malfunctioned or is not connected to storage device 20.

Figure 3:
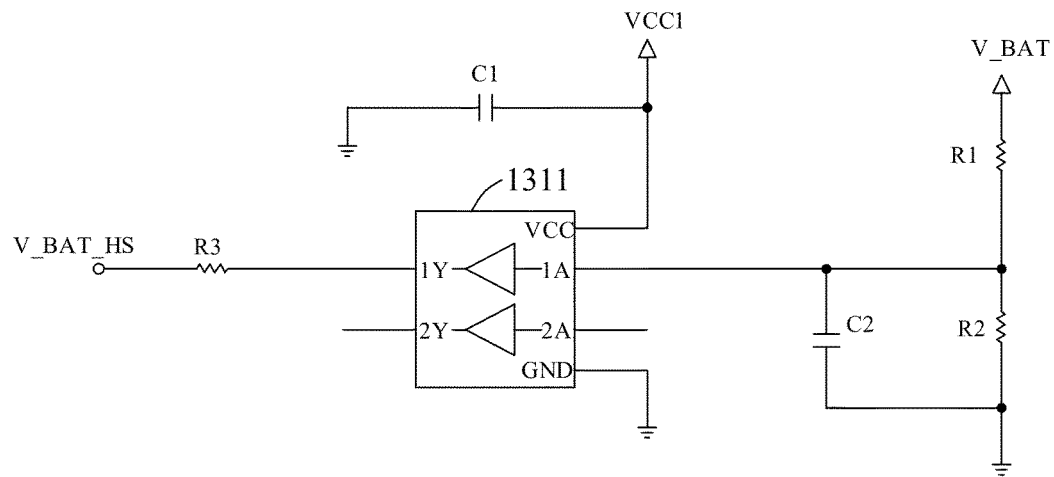
FIG. 3 is a partial circuit diagram of a detection circuit according to an embodiment of the present disclosure.
Figure 4:
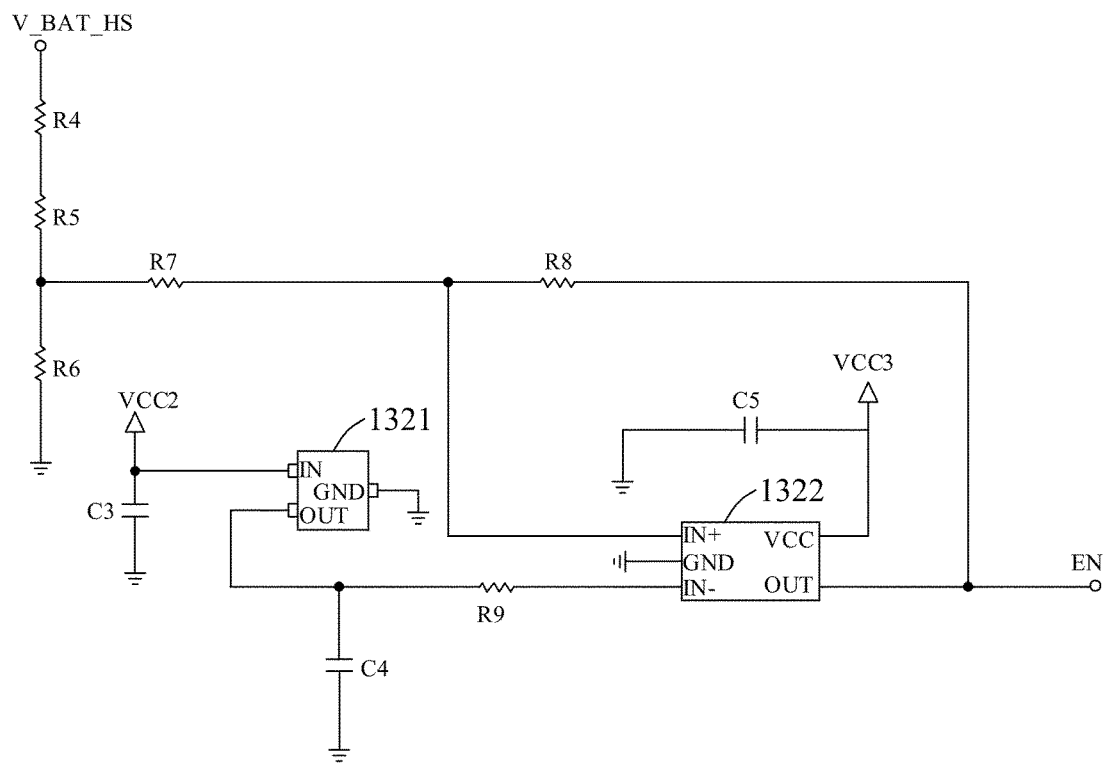
FIG. 4 is a partial circuit diagram of the detection circuit according to an embodiment of the present disclosure.

Referring to FIG. 3 and FIG. 4, in some embodiments, the detection circuit 130 includes a sample circuit 131 and a voltage comparison circuit 132. The sample circuit 131 includes a capacitor C1, a capacitor C2, a resistor R1, a resistor R2, a resistor R3, and a buffer 1311. The buffer 1311 includes a power pin VCC, a first input pin 1A, and a first output pin 1Y. The sample circuit 131 is used to sample the first voltage V_BAT output by the voltage output terminal 220 and output a sample voltage V_BAT_HS. The power pin VCC of the buffer 1311 is connected to a power supply VCC1, the first input pin 1A of the buffer 1311 receives the first voltage V_BAT through the resistor R1, the first input pin 1A of the buffer 1311 is grounded through the resistor R2, the first input pin 1A of the buffer 1311 is grounded through the capacitor C2, a ground pin GND of the buffer 1311 is grounded, and the first output pin 1Y of the buffer 1311 outputs the sample voltage V_BAT_HS through the resistor R3.

Referring to FIG. 4, in some embodiments, the voltage comparison circuit 132 includes capacitors C3-C5, resistors R4-R9, a reference voltage source 1321, and a voltage amplifier 1322.

The first input terminal IN+ of the voltage amplifier 1322 is connected to the output terminal of the sample circuit 131 through resistors R4-R7 to obtain the sample voltage V_BAT_HS. The second input terminal IN− of the voltage amplifier 1322 is connected to the output terminal OUT of the reference voltage source 1321 to obtain a reference voltage (i.e. the voltage threshold). The ground terminal GND of the reference voltage source 1321 is grounded, the input terminal IN of the reference voltage source 1321 is connected to a power supply VCC2, the input terminal IN of the reference voltage source 1321 is also grounded through the capacitor C3, the output terminal OUT of the reference voltage source 1321 is grounded through the capacitor C4, and the output terminal OUT of the reference voltage source 1321 is also connected to the second input terminal IN− of the voltage amplifier 1322 through resistor R9. The ground terminal GND of the voltage amplifier 1322 is grounded, the power pin VCC of the voltage amplifier 1322 is connected to a power supply VCC3, and the power pin VCC of the voltage amplifier 1322 is also grounded through the capacitor C5. The first input terminal IN+ of the voltage amplifier 1322 is connected to the output terminal OUT of the voltage amplifier 1322 through resistor R8, and the first input terminal IN+ of the voltage amplifier 1322 is also grounded through the resistor R7 and the resistor R6. The first input terminal IN+ of the voltage amplifier 1322 also receives the sample voltage V_BAT_HS through the resistor R7, the resistor R5, and the resistor R4. Therefore, the voltage amplifier 1322 can compare the sample voltage V_BAT_HS with reference voltage. In some embodiments, the first voltage and the sample voltage V_BAT_HS has a preset ratio relationship, and the voltage threshold and reference voltage also have the same preset ratio relationship. Therefore, the present application compares the sample voltage V_BAT_HS with the reference voltage to determine the magnitude between the first voltage V_BAT and the voltage threshold. In some embodiments, when the sample voltage V_BAT_HS is greater than or equal to the reference voltage, the output terminal EN of the voltage comparison circuit 132 outputs a first level signal to the controller 150. When the sample voltage V_BAT_HS is less than the reference voltage, the output terminal EN of the voltage comparison circuit 132 outputs a second level signal to the controller 150. The first level signal may be a high-level signal and the second level signal may be a low-level signal.

Therefore, the controller 150 receives the second level signal output from the voltage comparison circuit 132 of the detection circuit 130, determines that the first voltage is less than the voltage threshold, turns on the switch module 120 and obtains the state information of the storage device 20.

Figure 5:
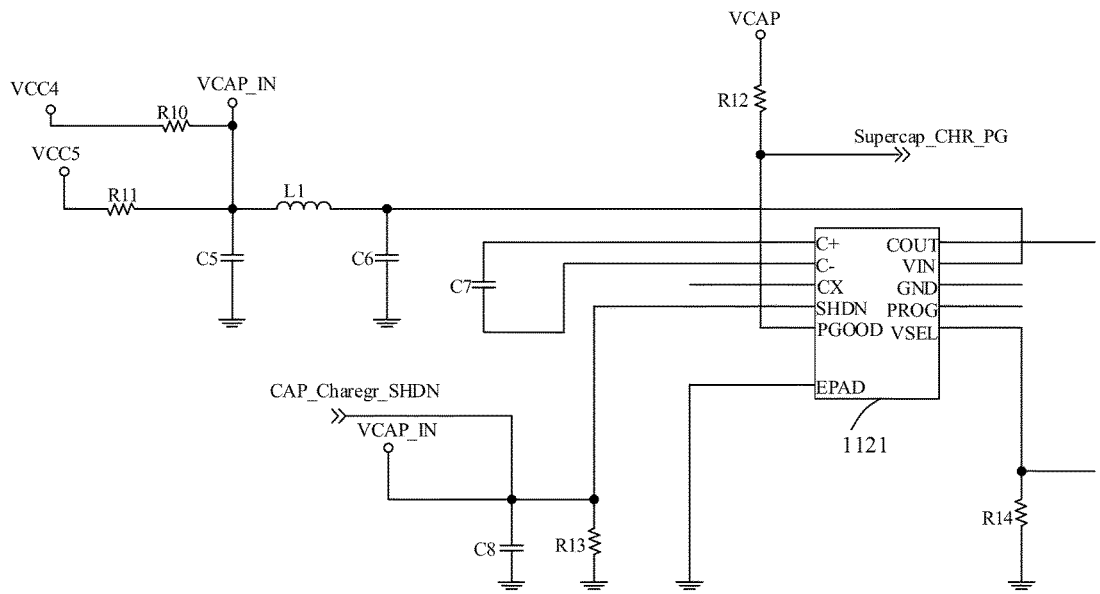
FIG. 5 is a partial circuit diagram of a charge circuit according to an embodiment of the present disclosure.

Referring to FIG. 5, in some embodiments, the charge circuit 112 includes resistors R10-R14, capacitors C5-C8, an inductor L1, and a charge chip 1121. The charge circuit 112 is used to obtain the electrical energy output by the voltage conversion circuit 210 to charge the supercapacitor 111. The EPAD pin of the charge chip 1121 is grounded, the power good signal pin PGOOD of the charge chip 1121 is connected to the switch module 120 through the resistor R12, the VSEL pin of the charge chip 1121 is grounded through the resistor R14, the C+ pin of the charge chip 1121 is connected to the C-pin of the charge chip 1121 through the capacitor C7, the SHDN pin of the charge chip 1121 is grounded through the resistor R13, and the SHDN pin of the charge chip 1121 is also grounded through the capacitor C8, the power pin VIN of the charge chip 1121 is grounded through the capacitor C6, and the power pin VIN of the charge chip 1121 is also connected to the power supply VCC5 through the inductor L1 and the resistor R11. A first end of the capacitor C5 is grounded, a second end of the capacitor C5 is connected to a node between the inductor L1 and the resistor R11, and the second end of the capacitor C5 is also connected to a power supply VCC4 through the resistor R10.

Figure 6:
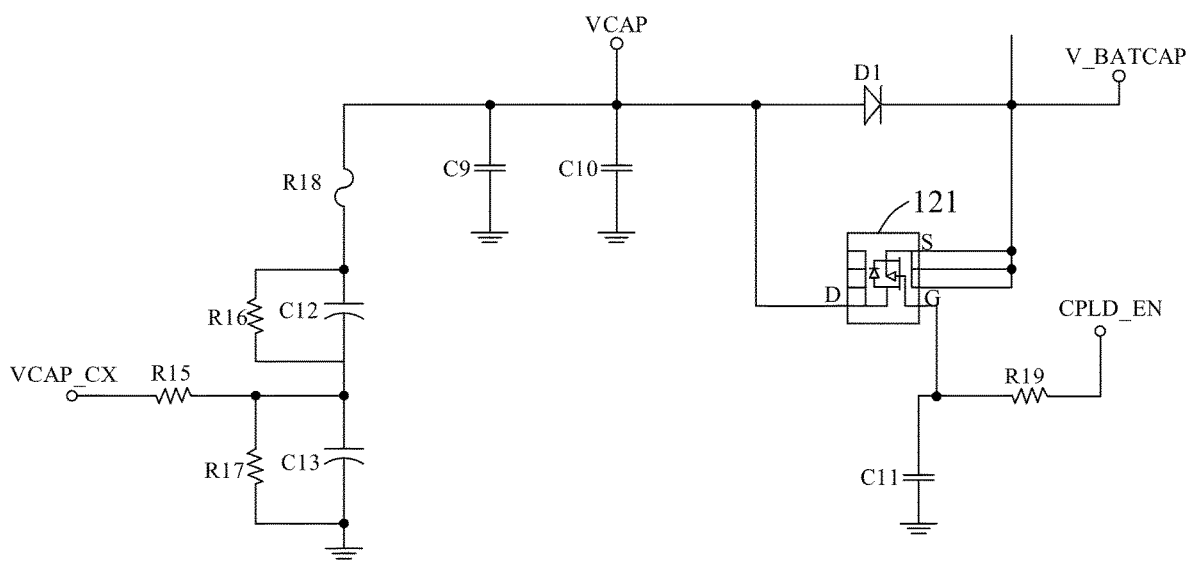
FIG. 6 is a partial circuit diagram of a switch circuit according to an embodiment of the present disclosure.

Referring to FIG. 6, in some embodiments, the switch module 120 includes a MOS transistor 121, a fuse R18, a resistor R19, a capacitor C9, a capacitor C10, a capacitor C11, and a diode D1. The supercapacitor 111 includes a capacitor C12 and a capacitor C13.

A gate of the MOS transistor 121 is connected to the control signal output terminal CPLD_EN of the controller 150 through the resistor R19, a source of the MOS transistor 121 is connected to the voltage output terminal V_BATCAP of the voltage conversion circuit 210, and a drain of the MOS transistor 121 is connected to the supercapacitor 111. Therefore, the MOS transistor 121 conducts or disconnects the path between the voltage output terminal V_BATCAP and the supercapacitor 111 under the control of the control signal output from the control signal output terminal CPLD_EN. When the MOS transistor 121 conducts under the control of the control signal, the supercapacitor 111 (i.e., the capacitor C12 and the capacitor C13) outputs a voltage to the voltage output terminal V_BATCAP, to supply power to the fault detection system 10 through the voltage output terminal V_BATCAP.

The gate of the MOS transistor 121 is also grounded through the capacitor C11, the source of the MOS transistor 121 is also connected to the cathode of the diode D1, the drain of the MOS transistor 121 is connected to the anode of the diode D1, the drain of the MOS transistor 121 is also grounded through the capacitor C10, the drain of the MOS transistor 121 is also grounded through the capacitor C9, the drain of the MOS transistor 121 is also grounded through the fuse R18, the capacitor C12, and the capacitor C13, the two ends of the resistor R16 are respectively connected to the two ends of the capacitor C12, and the two ends of the resistor R17 are respectively connected to the two ends of the capacitor C13.

The fuse R18 is disconnected when the current is too high to ensure the safety of the fault detection system 10.

In some embodiments, multiple switches are also provided at each power input terminal of the fault detection system 10, which can be disconnected in a timely manner in case of circuit overcurrent or short circuit, to reduce the impact on the voltage output terminal 220.

Figure 7:
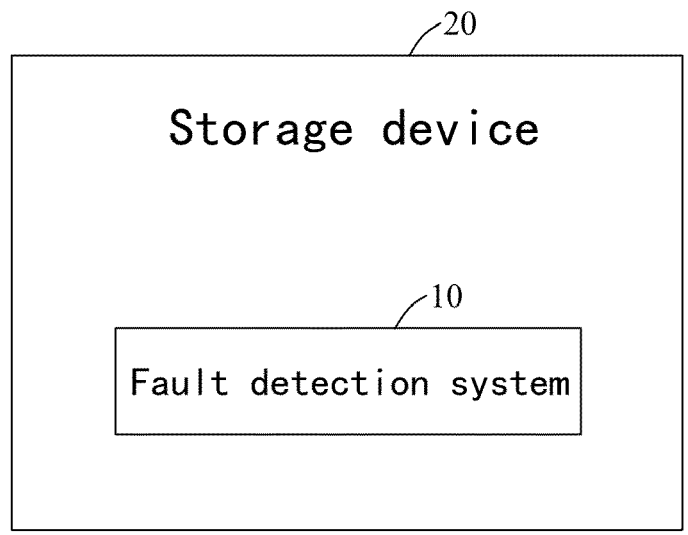
FIG. 7 is a block diagram of a storage device according to an embodiment of the present disclosure.

Referring to FIG. 7, the present application further provides a storage device 20. The storage device 20 includes a fault detection system 10 as described above. The storage device 20 is any of JBOD storage devices, JBOF storage devices, or RAID storage devices.

Figure 8:
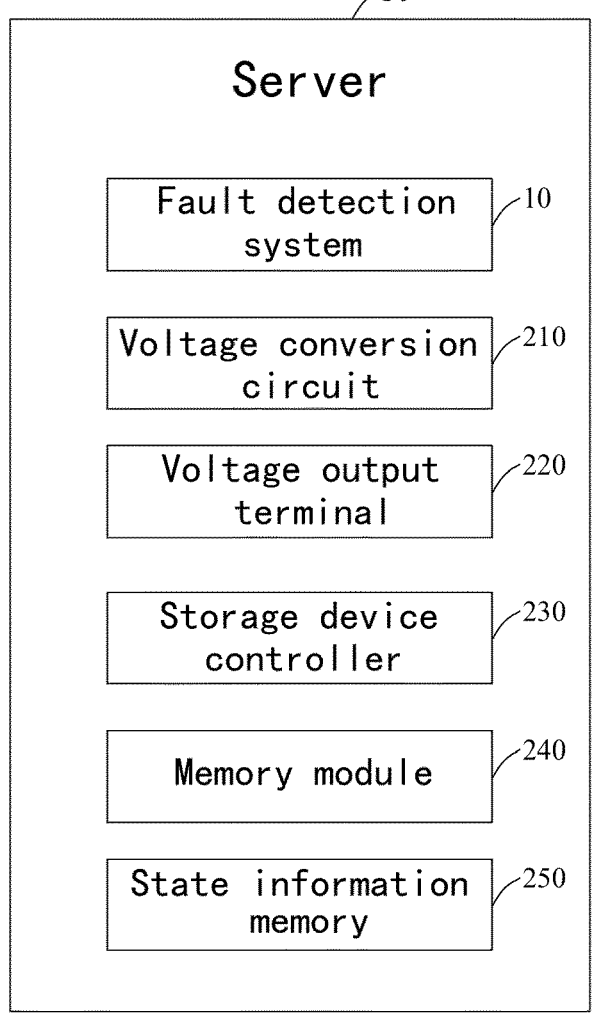
FIG. 8 is a block diagram of a server according to an embodiment of the present disclosure.

Referring to FIG. 8, the present application further provides a server 30. The 30 includes the voltage conversion circuit 210, the voltage output terminal 220, the storage device controller 230, the memory module 240, the state information memory 250, and the fault detection system 10 as described above.

Those of ordinary skill in the art should realize that the above embodiments are only used to illustrate the present disclosure, but not to limit the present disclosure. As long as they are within the essential spirit of the present disclosure, the above embodiments are appropriately made and changes fall within the scope of protection of the present disclosure.

What is claimed is:
1. A fault detection system applied to a storage device, the storage device comprising a voltage conversion circuit and a voltage output terminal, the voltage conversion circuit configured to convert a first supply voltage and output a second supply voltage to the voltage output terminal, the voltage output terminal configured to output a first voltage to provide power to the fault detection system, and the fault detection system comprising:
   a supercapacitor circuit configured to obtain electrical energy from the voltage conversion circuit and store the electrical energy;

a switch module configured to conduct or disconnect a connection between the supercapacitor circuit and the voltage output terminal, a controller configured to turn on the switch module, obtain state information of the storage device, and control a reminder circuit to output reminder information based on the state information when the first voltage is less than a voltage threshold.

2. The fault detection system of claim 1, wherein the controller is configured to turn off the switch module when the first voltage is greater than or equal to the voltage threshold.

3. The fault detection system of claim 2, wherein when the switch module is turned on, the switch module conducts the connection between the supercapacitor circuit and the voltage output terminal, when the switch module is turned off, the switch module disconnects the connection between the supercapacitor circuit and the voltage output terminal.

4. The fault detection system of claim 1, wherein the supercapacitor circuit comprises a charge circuit and a supercapacitor, the charge circuit is configured to convert the second supply voltage output by the voltage conversion circuit into a second voltage, and output the second voltage to charge the supercapacitor; the supercapacitor is configured to store the electrical energy and output a voltage to the voltage output terminal when the switch module is turned on.

5. The fault detection system of claim 1, wherein the fault detection system further comprises an anti-reverse circuit, and the anti-reverse circuit is configured to prevent a current of the supercapacitor circuit from flowing back into the voltage conversion circuit.

6. The fault detection system of claim 5, wherein the anti-reverse circuit comprises a diode, an anode of the diode is connected between the voltage conversion circuit and the supercapacitor circuit, and a cathode of the diode is connected between the voltage output terminal and the switch module.

7. The fault detection system of claim 1, wherein the fault detection system further comprises a detection circuit, the detection circuit is connected between the voltage output terminal and the controller, the controller is configured to detect the first voltage through the detection circuit.

8. A storage device comprising:
a voltage conversion circuit configured to convert a first supply voltage and output a second supply voltage to a voltage output terminal, the voltage output terminal configured to output a first voltage,
a fault detection system comprising:
a supercapacitor circuit configured to obtain electrical energy from the voltage conversion circuit and store the electrical energy;
a switch module configured to conduct or disconnect a connection between the supercapacitor circuit and the voltage output terminal,
a controller configured to turn on the switch module, obtain state information of the storage device, and control a reminder circuit to output reminder information based on the state information when the first voltage is less than a voltage threshold.

9. The storage device of claim 8, wherein the controller is configured to turn off the switch module when the first voltage is greater than or equal to the voltage threshold.

10. The storage device of claim 9, wherein when the switch module is turned on, the switch module conducts the connection between the supercapacitor circuit and the voltage output terminal, when the switch module is turned off, the switch module disconnects the connection between the supercapacitor circuit and the voltage output terminal.

11. The storage device of claim 8, wherein the supercapacitor circuit comprises a charge circuit and a supercapacitor, the charge circuit is configured to convert the second supply voltage output by the voltage conversion circuit into a second voltage, and output the second voltage to charge the supercapacitor; the supercapacitor is configured to store the electrical energy and output a voltage to the voltage output terminal when the switch module is turned on.

12. The storage device of claim 8, wherein the fault detection system further comprises an anti-reverse circuit, and the anti-reverse circuit is configured to prevent a current of the supercapacitor circuit from flowing back into the voltage conversion circuit.

13. The storage device of claim 12, wherein the anti-reverse circuit comprises a diode, an anode of the diode is connected between the voltage conversion circuit and the supercapacitor circuit, and a cathode of the diode is connected between the voltage output terminal and the switch module.

14. The storage device of claim 8, wherein the fault detection system further comprises a detection circuit, the detection circuit is connected between the voltage output terminal and the controller, the controller is configured to detect the first voltage through the detection circuit.

15. A server comprising:
a voltage conversion circuit configured to convert a first supply voltage input from an external power source and output a second supply voltage to a voltage output terminal, the voltage output terminal configured to output a first voltage, and
a fault detection system comprising:
a supercapacitor circuit configured to obtain electrical energy from the voltage conversion circuit and store the electrical energy;
a switch module configured to conduct or disconnect a connection between the supercapacitor circuit and the voltage output terminal,
a controller configured to turn on the switch module, obtain state information of the storage device, and control a reminder circuit to output reminder information based on the state information when the first voltage is less than a voltage threshold.

16. The server of claim 15, wherein the controller is configured to turn off the switch module when the first voltage is greater than or equal to the voltage threshold.

17. The server of claim 16, wherein when the switch module is turned on, the switch module conducts the connection between the supercapacitor circuit and the voltage output terminal, when the switch module is turned off, the switch module disconnects the connection between the supercapacitor circuit and the voltage output terminal.

18. The server of claim 15, wherein the supercapacitor circuit comprises a charge circuit and a supercapacitor, the charge circuit is configured to convert the second supply voltage output by the voltage conversion circuit into a second voltage, and output the second voltage to charge the supercapacitor; the supercapacitor is configured to store the electrical energy and output a voltage to the voltage output terminal when the switch module is turned on.

19. The server of claim 15, wherein the fault detection system further comprises an anti-reverse circuit, and the anti-reverse circuit is configured to prevent a current of the supercapacitor circuit from flowing back into the voltage conversion circuit.

20. The server of claim 19, wherein the anti-reverse circuit comprises a diode, an anode of the diode is connected between the voltage conversion circuit and the supercapacitor circuit, and a cathode of the diode is connected between the voltage output terminal and the switch module.

* * * * *